United States Patent [19]
Hugo

[11] Patent Number: 5,988,257
[45] Date of Patent: Nov. 23, 1999

[54] METHOD AND THE DIRECTIONAL SOLIDIFICATION OF A MOLTEN METAL AND A CASTING APPARATUS FOR THE PRACTICE THEREOF

[75] Inventor: Franz Hugo, Aschaffenburg, Germany

[73] Assignee: Ald Vacuum Technologies GmbH, Germany

[21] Appl. No.: 09/112,922

[22] Filed: Jul. 9, 1998

[30] Foreign Application Priority Data

Jul. 17, 1997 [DE] Germany .......................... 197 30 637

[51] Int. Cl.⁶ .................................................. B22D 27/04
[52] U.S. Cl. ...................... 164/122.1; 164/126; 164/128
[58] Field of Search ............................ 164/122.1, 122.2, 164/348, 126, 128

[56] References Cited

U.S. PATENT DOCUMENTS

| | | |
|---|---|---|
| 3,635,279 | 1/1972 | Matsunaga et al. .................... 164/128 |
| 3,763,926 | 10/1973 | Tschinkel . |
| 4,108,236 | 8/1978 | Salkeld . |
| 4,190,094 | 2/1980 | Giamei . |

FOREIGN PATENT DOCUMENTS 43 21 640 A1  1/1995  Germany .

Primary Examiner—Kuang Y. Lin
Attorney, Agent, or Firm—Fulbright & Jaworski, LLP

[57] ABSTRACT

A casting apparatus has within a heating chamber (6) a mold (5) which can be moved out of the heating chamber (6) into a molten cooling metal (10) disposed beneath it. As heat insulation between the heating chamber (6) and the molten cooling metal (10) a thermal insulation layer (13) floating on the molten cooling metal is provided through which the mold (5) dips into the molten cooling metal (10). To prevent clumping within the thermal insulation layer (13) a rake or stirrer (19) is provided, which is driven by a shaker (17) and whisks or stirs the thermal insulation layer.

15 Claims, 2 Drawing Sheets

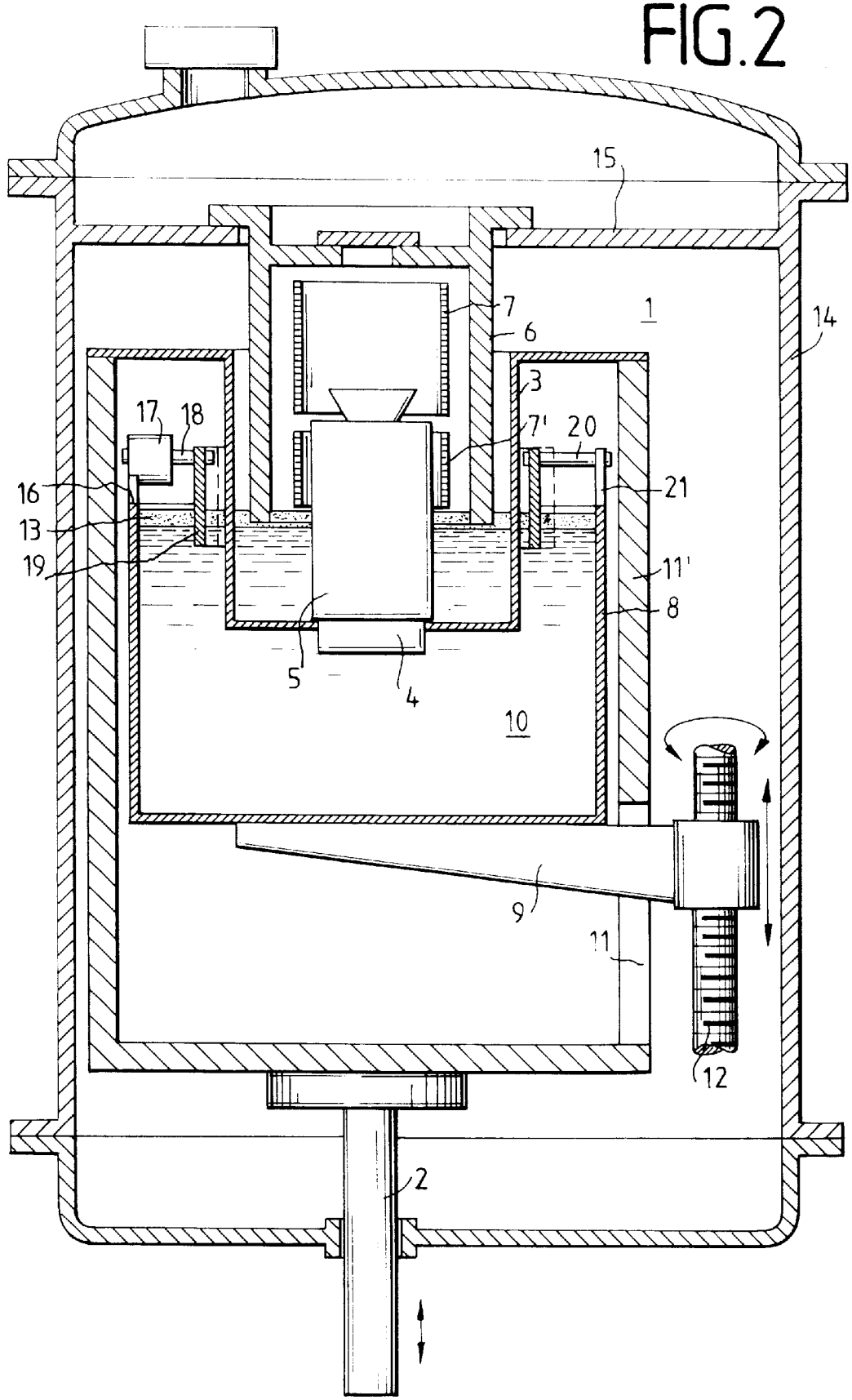

5,988,257

METHOD AND THE DIRECTIONAL SOLIDIFICATION OF A MOLTEN METAL AND A CASTING APPARATUS FOR THE PRACTICE THEREOF

FIELD OF THE INVENTION

The invention relates to a method for the directional solidification of a molten metal—nickel for example—poured into a mold, by moving the mold out of a heating chamber and immersing the mold into a molten metal bath of lower melting point than the molten metal in the mold, such as aluminum, which is covered by a layer of thermal insulation. The invention furthermore relates to a casting apparatus for the practice of this method.

DESCRIPTION OF THE PRIOR ART

Such a method and such casting apparatus are subjects of DE-A-28 15 818. The lowering of the mold into the cooling melt serves for the purpose of achieving a solid/fluid zone of the least possible depth plus a phase boundary between solid and fluid running transversely of the main length of the casting in the mold by means of an intensive axial heat flow during the solidification of the said casting, so that the crystals will grow axially into the casting. This aim makes it necessary to keep the radial radiation loss of heat from above the cooling bath as low as possible. For this purpose, in the known casting apparatus, a radiation shield, generally called a baffle, is provided at the bottom of the heat chamber and facing the mold. In addition, a separating plate of thermal insulating material is provided, which has an opening for the immersion of the mold into the cooling bath. The heat blockage, however, is imperfect, especially when the castings have a plurality of downwardly pointing parts, since then the radiation shield and the separating plate cannot reach the areas between these parts. In any case a gap necessarily remains between the mold and the radiation shield and between the mold and the separating plate, and through this gap heat is radiated away.

For the immersion of a mold containing molten metal to be cooled, DE-B-19 53 716 also shows a tank containing a molten cooling bath whose surface is covered by a thermal insulating layer. This layer aims to prevent oxidation or excessive cooling of the cooling bath. When lowered into the cooling bath the mold penetrates this thermal insulating layer. However, it is not moved out of a heating chamber.

In a process of this kind, DE-B-22 42 111 teaches to place the surface of the cooling bath so closely underneath the heating chamber that the cooling plate of the mold is at least partly immersed in the cooling bath before the mold is immersed. Thus the cooling plate is cooled by the cooling bath precisely when the mold is filled, so that it provides an especially good cooling action. To prevent heat losses between the bottom end of the heating chamber and the mold a heat shield is provided in the apparatus according to DE-B-22 42 111.

Also known (EP 0 571 703 A1) is a method for producing a metal casting by the fine casting process, especially a casting of aluminum or an aluminum-containing alloy, by pouring a molten metal into a mold of ceramic having porous walls, and cooling and solidifying the melt by using a coolant. The coolant is a cooling fluid which gradually penetrates the wall of the mold and whose boiling temperature is lower than the pouring temperature of the melt. The mold is steadily lowered into the coolant beginning from one end, such that the solidifying interface forming as a boundary surface between molten metal and metal that has solidified, and the region of penetration in which the mold wall is penetrated through its thickness by the cooling fluid, move substantially toward the free surface of the melt, while the rate of immersion of the mold into the cooling fluid, the thickness and the porosity of the mold wall as well as the viscosity and the density of the coolant are so coordinated that, as seen in the direction of movement of the solidification front, the penetration region lags behind the solidification front.

Lastly, there is known (EP 0 631 832 A1) a method for the directional solidification of a molten metal, nickel for example, poured into a mold, and for lowering the mold into a molten metal bath of lower melting point than the molten metal in the mold, such as aluminum for example. To provide a seal between the heating chamber and the mold, a thermal insulating layer consisting of a loose material floating on the cooling bath is placed upon the latter, and before the mold pierces through the thermal insulation layer and enters the cooling bath, the heating chamber or the cooling bath is transported to such an extent that the heating chamber contacts the thermal insulation layer or enters into it. The thermal insulation layer consists in this case of granules of graphite, ceramic or aluminum oxide with a coating that prevents wetting, boron nitride being used as this coating.

SUMMARY OF THE INVENTION

The invention is addressed to the problem of improving a method of the kind referred to in the beginning such that the thermal insulation layer floating on the molten metal behaves under all conditions as a loose mass of uniform consistency having no tendency to gather in clumps, or to cake up, or otherwise form local solids.

This problem is solved according to the invention by a rake, paddle or stirrer driven by a shaker or vibrator and entering into the thermal insulation layer, the shaker, vibrator or driver being fixedly disposed on the top edge of the crucible, and the rake, paddle or stirrer being operatively connected to the reciprocating drive.

Additional details are further identified and described in the claims.

BRIEF DESCRIPTION OF THE DRAWINGS

The invention admits of numerous embodiments. To explain its basic principle, one of them is shown in the drawings and described herewith.

FIG. 2 is a section corresponding to FIG. 1 with the mold partially shifted out of the heating chamber into a molten cooling bath.

DETAILED DESCRIPTION

Figure 1:
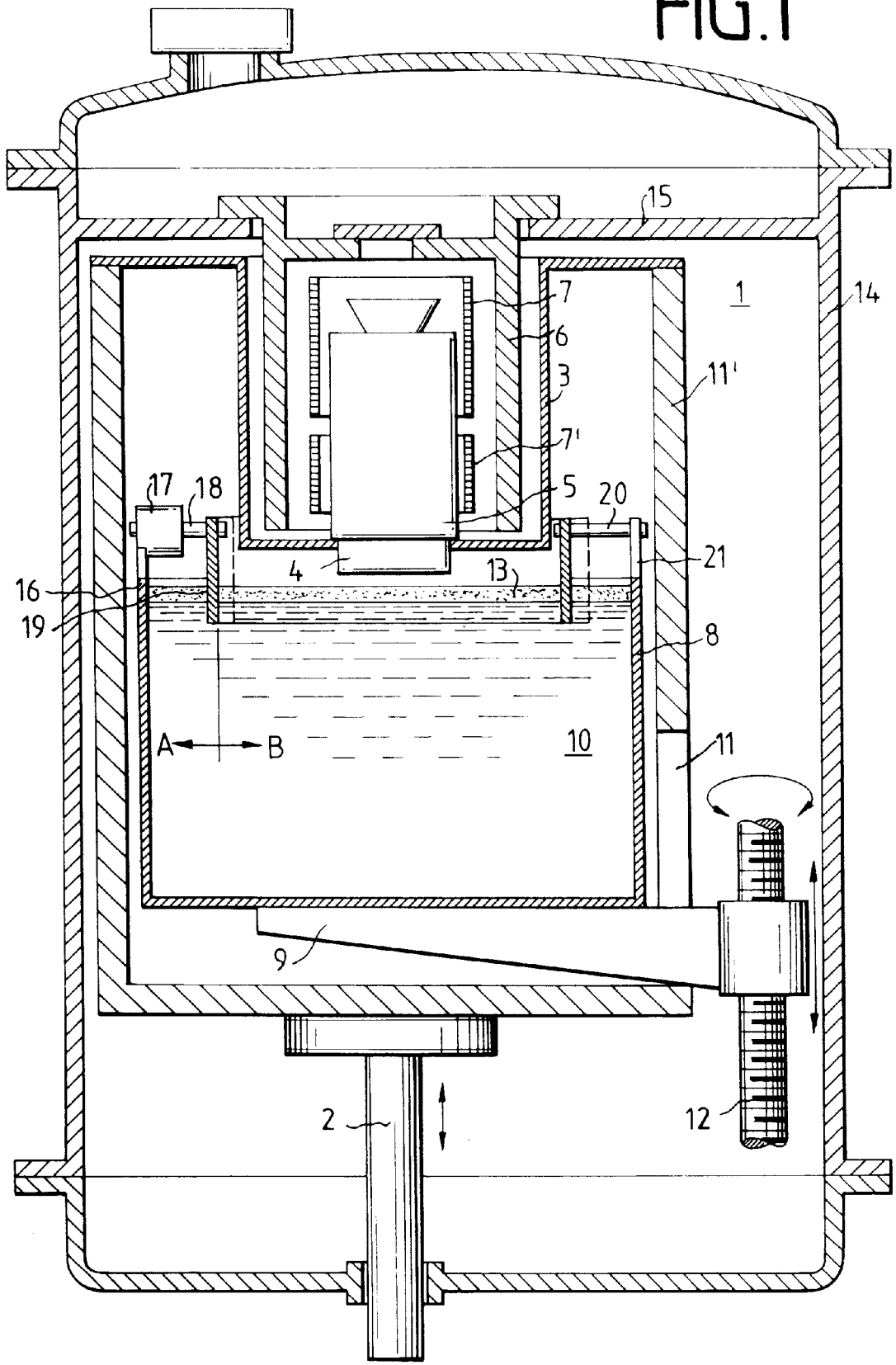
FIG. 1 is a diagrammatic longitudinal section through a casting apparatus according to the invention with a mold placed into a heating chamber.

FIG. 1 shows a lift chamber 1 which is mounted on a plunger 2 and can be raised or lowered by the movement of the plunger 2. A holding frame 3, which can be a basket-like article of graphite, supported on the lift chamber 1, extends downwardly into the lift chamber 1. On this holding frame 3 rests a cooling plate 4 which forms the bottom of a mold 5. In the pouring position represented, the mold 5 is completely within a heating chamber 6 which contains electrical heating elements 7, 7' in the form of rings around the mold.

Underneath the heating chamber 6 a crucible 8 is disposed on a support 9 and contains a molten cooling metal 10. The support 9 reaches through a slot 11 in the lift chamber 1 and can be raised and lowered on a vertical guide 12 in the form of a spindle drive. Important to the invention is a thermal insulating layer 13, consisting for example of aluminum oxide in powder or granular form, which floats on the molten cooling metal 10.

When the mold 5 is filled with molten metal and it is desired to start the directional solidification, first the crucible 8 with the molten cooling metal 10 is lifted by raising the support 9 on the vertical guide 12, until the bottom edge of the heating chamber 6 enters slightly into the thermal insulating layer 13, so that a visible separation is formed between the interior of the heating chamber 6, i.e., the heating space, and the cooling space, i.e., the molten cooling metal 10. Then the operator begins to move the plunger 2 downwardly, thus lowering the lifting chamber 1 with the holding frame 3 so that the mold 5 increasingly penetrates the thermal insulation layer 13 and enters into the molten cooling metal 10, which is shown in FIG. 2. This downward movement of the lift chamber 1 is continued until the mold 5 is entirely immersed in the molten cooling metal 10 and the casting in it is thus solidified.

In FIGS. 1 and 2 it is additionally shown that the entire casting apparatus is disposed in the usual manner in a vacuum chamber 14. The latter has an inwardly reaching, flange-like collar 15 on which the heating chamber 6 is supported. Not shown is a tilting crucible from which the molten metal can be poured into the mold 5 after the cover 16 is opened.

To assure that the thermal insulating layer 13 consisting of granules of graphite, ceramic or aluminum oxide with a coating that prevents wetting is always uniformly spread out over the entire surface of the melt, and also that the composition of the layer does not vary during operation, i.e., so that no sintering together of the coating 13 takes place, a stirring device comprising a motor-driven shaker or vibrator 17 and a ring 19 is fixedly mounted on the upper edge 16 of the crucible and drives ring 19 at least horizontally back and forth by an arm or rod in the direction A-B. This ring can be made of perforated plate or can also be a solid cylinder wherein the height of said siring device corresponding approximately to the thickness of the thermal insulating layer. To prevent tipping the ring 19 into the molten metal 10 the ring 19 is held and guided by a rod 20 extending radially outward from it into a bore which is provided in an arm 21 extending perpendicularly from the edge 16 of the crucible 8. The stirring ring 19 is rotated back and forth about a vertically disposed longitudinal axis of the crucible 8.

The movement of the stirring device is a combination of a reciprocal vertical movement and reciprocal horizontal movement. The movement of the stirrer is a combination of an up-and-down movement with a back-and-forth movement or to-and-fro movement.

What is claimed is:

1. A method for the directional solidification of a molten metal poured into a mold, said method comprising:
   providing a molten metal bath of a molten coolant metal having a lower melting point than that of the molten metal in the mold, said bath having a floating thermal insulation layer of a loose material on the molten coolant metal as sealant between the heating chamber and the mold;
   moving the mold out of a heating chamber having an interior and cooling the mold by immersing the mold in the molten coolant metal;
   causing relative movement of the heating chamber and the molten coolant metal before the mold penetrates through the thermal insulation layer and enters into the molten coolant metal so that the heating chamber contacts the thermal insulation layer and the thermal insulation layer acts as an insulating barrier between the interior of the heating chamber; and
   stirring or whisking the thermal insulation layer by a motor-driven stirring device.

2. The method of claim 1 wherein the molten metal in the mold comprises nickel and the molten coolant metal, comprises aluminum.

3. The method according to claim 1, wherein the stirring device is configured as a ring surrounding the mold, which is moved back and forth by a shaker in a horizontal plane.

4. The method according to claim 1, wherein the stirring device is configured as a grid or grate.

5. The method according to claim 1, wherein the stirring device has a height corresponding approximately to the thickness of the thermal insulation layer.

6. The method according to claim 1, wherein the movement of the stirring device is a combination of a reciprocal vertical movement and a reciprocal horizontal movement.

7. The method according to claim 1, wherein the stirring device has an upper margin supported on guides which comprises pins or bolts, said guides extending in a horizontal plane and being provided on an upper end of a crucible containing the molten cooling metal.

8. An apparatus for the directional solidification of a molten metal poured into a mold, said apparatus comprising:
   a heating chamber having an interior receiving therein said mold, said chamber having an edge defining an exit through which the mold can move out of the interior thereof;
   means for moving the mold out of the heating chamber and immersing the mold into a molten metal bath of a molten coolant metal having a lower melting point than that of the molten metal in the mold;
   a floating thermal insulation layer of a loose material being placed on the molten coolant metal between the heating chamber and the molten metal bath, and
   means for causing relative movement between the heating chamber and the molten coolant metal such that the heating chamber contacts the thermal insulation layer before the mold penetrates the thermal insulation layer; and
   a stirrer driven by a vibration generator, said stirrer extending into the thermal insulation layer, the vibration generator being supported on an upper margin of a crucible holding the molten coolant metal, and the stirrer being operatively connected with a reciprocating drive member of the vibration generator.

9. The apparatus of claim 8 wherein the molten metal in the mold comprises nickel and the molten coolant metal comprises a molten aluminum bath.

10. The apparatus according to claim 8 wherein the stirrer is configured as a ring surrounding the mold, which is moved back and forth by the vibration generator in a horizontal place.

11. The apparatus according to claim 8 wherein the stirrer is configured as a grid or grate.

12. The apparatus according to claim 8 wherein the stirrer has a height corresponding approximately to the thickness of the thermal insulation layer.

13. The apparatus according to claim 8 wherein the movement of the stirrer is a combination of an up-and-down movement with a back-and-forth movement or to-and-fro movement.

14. The apparatus according to claim 8 wherein the stirrer has an upper margin supported on guides which comprises pins or bolts, said guides extending in a horizontal plane, which are provided on the upper margin of the crucible containing the molten cooling metal.

15. The apparatus according to claim 8 wherein the stirrer is configured as a ring surrounding the mold, which is rotated back and forth about a vertically disposed longitudinal axis of the crucible.

* * * * *

UNITED STATES PATENT AND TRADEMARK OFFICE
CERTIFICATE OF CORRECTION

PATENT NO. : 5,988,257
DATED : November 23, 1999
INVENTOR(S) : Franz Hugo

Page 1 of 1

It is certified that error appears in the above-identified patent and that said Letters Patent is hereby corrected as shown below:

Column 1,
Line 1, change "AND" to --FOR--.
Line 66, after the word "wall" delete period.

Column 33,
Line 31, change "siring" to --stirring--.
Line 66, delete comma.

Signed and Sealed this

Nineteenth Day of June, 2001

*Attest:*

NICHOLAS P. GODICI
*Attesting Officer*     *Acting Director of the United States Patent and Trademark Office*